United States Patent [19]

Sharman

[11] Patent Number: 5,349,546

[45] Date of Patent: Sep. 20, 1994

[54] METHOD AND APPARATUS FOR NON-LINEAR SIGNAL PROCESSING WITH REDUCED UPPER HARMONIC COMPONENTS

[75] Inventor: Richard A. Sharman, Dunstable, England

[73] Assignee: Eastman Kodak Company, Rochester, N.Y.

[21] Appl. No.: 889,694

[22] Filed: Jun. 1, 1992

[51] Int. Cl.⁵ .................................................. G06F 15/31
[52] U.S. Cl. ............................ 364/724.01; 364/724.16
[58] Field of Search ..................... 364/724.01, 724.16, 364/736, 754

[56] References Cited

U.S. PATENT DOCUMENTS

| 4,758,893 | 7/1988 | Lippel | 358/209 |
|---|---|---|---|
| 4,766,563 | 8/1988 | Fujimoto | 364/724.16 |
| 4,786,968 | 11/1988 | Kutner | 358/164 |
| 4,812,903 | 3/1989 | Wagensonner et al. | 358/80 |
| 4,825,297 | 4/1989 | Fuchberger et al. | 358/284 |

FOREIGN PATENT DOCUMENTS 91-03122  3/1991  PCT Int'l Appl. .
2240001  7/1991  United Kingdom .

*Primary Examiner*—Tan V. Mai
*Attorney, Agent, or Firm*—David M. Woods

[57] ABSTRACT

In a sampled data system with limited bandwidth where the output of a table memory 34 is multiplied with the sampled data in a multiplier 36 to produce a non-linear function, the process ordinarily produces harmonics that fold back into the passband of the system, thus causing artifacts in the processed data. By filtering the sampled data in a low pass filter 30 before addressing the table memory 34, the non-linearity of the function is progressively reduced toward the upper band limit. This reduces the production of harmonics and the resultant artifacts.

11 Claims, 2 Drawing Sheets

METHOD AND APPARATUS FOR NON-LINEAR SIGNAL PROCESSING WITH REDUCED UPPER HARMONIC COMPONENTS

FIELD OF INVENTION

This invention relates to the processing of sampled data through a non-linear system.

BACKGROUND OF THE INVENTION

When carrying out non-linear processing of sampled data with well-defined, limited bandwidths, the harmonics produced by components close to the Nyquist sampling limit result in aliasing, that is, frequencies that fold back into the passband of the system. Because these folded-back frequencies cannot be removed by post-filtering, they cause artifacts that degrade the final processed data. A good example of non-linear processing is in television scanning systems, where the transfer characteristic between the driving signal into a cathode ray tube and the light given out by the tube is non-linear. Indeed, the light output by the tube is closely proportional to the input raised to a constant power. This power-law constant is called the gamma of the display tube, and the process of correction, basically to multiply the signal by the inverse of the gamma constant, is called gamma correction.

In an analog television system, the analog gamma correction circuit ordinarily has adequate bandwidth to handle the harmonic frequencies generated. In a digital television system, gamma correction is desirably implemented digitally, typically by using the input video to address a read-only memory (used as a look-up memory) that has been programmed with a table of output values based upon the non-linear gamma function. Each input video sample functions as an address for producing a corrected output video sample according to the function. Due to the limited bandwidth of a digital system and to its sampled nature, however, any harmonics produced above the Nyquist limit will be folded back to produce artifacts in the final picture. The normal Nyquist requirement is to sample the analog input signal at a frequency that is at least twice the highest possible input frequency. This will prevent aliasing at the input. However, a subsequent non-linear operation, such as gamma correction, performed on the sampled signals produces harmonic components, especially upper harmonics, that fold back into the signal spectrum, even though the initial sampling of the input analog signal met the Nyquist requirement.

Current methods to overcome this problem include de-emphasizing the high frequency components prior to the non-linear process and then to re-emphasize these components after the process. An example of this method is described in International Publication No. WO 91/03122, which was published Mar. 7, 1991 in the name of Rank Cintel, Limited. The problem with this method is that the harmonics are only reduced, and not eliminated, Another well-known approach to this problem up-converts the sampled data by interpolation to, e.g., double the effective samples and thereby to increase the effective bandwidth of the system while keeping the bandwidth of the data the same. While this method produces accurate results, the problem is with the much increased complexity in the signal processing.

SUMMARY OF THE INVENTION

The present invention is directed to overcoming the problems set forth above. Briefly summarized, according to one aspect of the present invention, a method for the processing of sampled data with reduced upper harmonic components includes the steps of: storing a non-linear function in a look-up table memory such that each table input generates a table output based upon the transfer characteristic of the non-linear function; low pass filtering the sampled data; addressing the input of the look-up table memory with the low pass filtered data; and multiplying the sampled data by the output of the look-up table memory to provide output data free of artifacts.

By filtering the sampled data in a low pass filter before addressing the table memory, the non-linearity of the function is progressively reduced toward the upper band limit. This reduces the production of harmonics and the resultant artifacts.

BRIEF DESCRIPTION OF THE DRAWINGS

The invention will be described in relation to the drawings, wherein.

DESCRIPTION OF THE PREFERRED EMBODIMENTS

Figure 1:
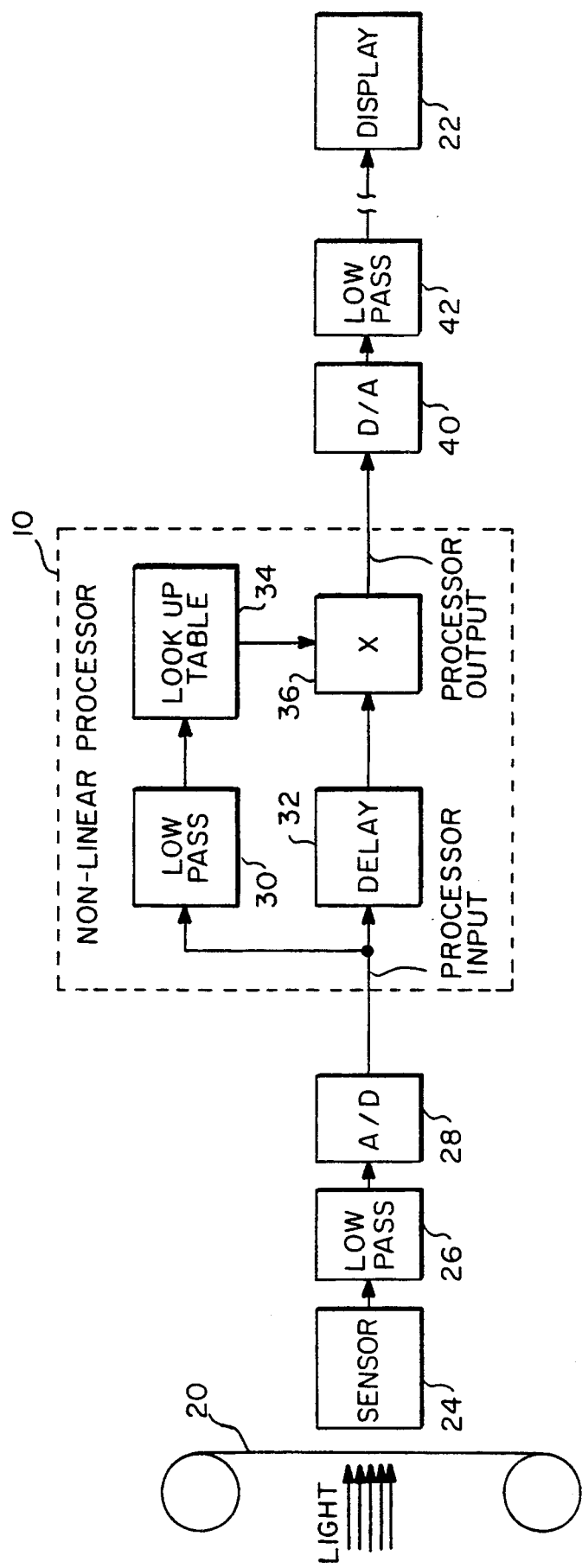
FIG. 1 is a block diagram of a non-linear processor according to the invention as used in a telecine film scanning system.

Referring initially to FIG. 1, a non-linear processor 10 is shown for use in a telecine film scanning system of the type that converts optical images on a motion picture film 20 into television signals that ultimately drive a cathode ray tube display 22. Light is directed through the film 20 in a scanning operation and thereupon strikes the active elements of a sensor 24. This produces an analog image signal having a bandwidth dependent upon the number of active elements and the particular scanning standard in use. To meet the Nyquist sampling rate requirement, the analog image signal is band-limited (to a bandwidth W) by a low pass filter 26 and sampled by an analog-to-digital (A/D) converter 28 at a rate equal to at least twice (2W) the bandwidth of the image signal.

Figure 2:
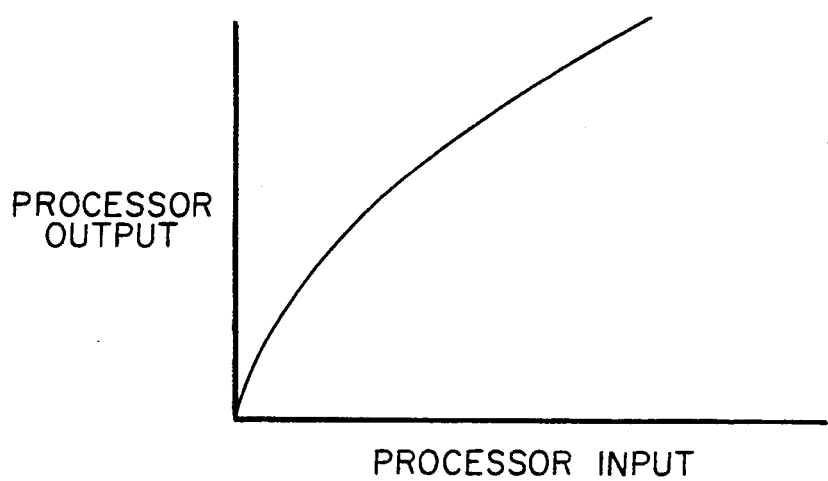
FIG. 2 is a graph of a non-linear gamma function implemented by the non-linear processor of FIG. 1.

The sampled image data is applied to the non-linear processor 10, which implements a gamma correction according to the relationship graphed in FIG. 2. As shown therein, the input of the non-linear processor 10 is the abscissa and the output of the non-linear processor is the ordinate. This relationship implements a gamma correction by effectively raising each sample value to the power of 1/gamma to correct for the power law characteristic of the cathode ray tube display 22. According to the invention, sampled data is applied to a low pass filter 30 and to a delay element 32. The output of the low pass filter 30 is applied, as a sequence of addresses, to the address input of a read-only memory 34 programmed as a look-up table (and hereinafter referred to as table memory 34).

The table entries contain gain factor adjustments corresponding to the non-linear function illustrated in FIG. 2, that is, multiplier coefficients that can be applied to an input signal to generate the output shown in FIG. 2. Each input address to the table 34 therefore generates a table output related to the transfer characteristic of the non-linear function performed by the processor 10. The output of the table 34 thus constitutes a set of multiplier coefficients that are applied to a multiplier 36, which also receives input data from the delay 32. The delay 32 equalizes the delay inherent the filter 30, thereby bringing the output of the delay 32 and the output of the table 34 into time coincidence for correct multiplication by the multiplier 36. The gain adjustment values in the table 34 are chosen such that multiplication of the input data from the delay 32 by the values from the table 34 replicates the transfer characteristic of the non-linear function shown in FIG. 2.

The benefit of the invention is obtained by changing the effect of the non-linear gain function implemented by the table 34 in the presence of higher signal frequencies. More particularly, the gain values output by the table 34 in the presence of higher input frequencies are selected in such a way as to become a linear function. Thus there are no harmonics generated and, consequently, no aliasing is produced. This selection is accomplished by the low pass filter 30, which has a filter characteristic that tails off in the higher frequencies and thereby converts a sequence of rapidly changing (i.e., high frequency) data samples into a sequence of mean values. When these mean values are used to address the table 34, they effectively linearize the output of the table 34 when high frequencies are being processed, thus putting out average or smoothed values to the multiplier 36 when high frequencies are present. These average or mean values are then multiplied with the input high frequencies in a (temporarily) linear process that does not produce harmonics. Since the filtering effect of the filter 30 gradually increases at the edge of the filter passband, this effect gradually increases as higher frequencies are encountered by the non-linear processor 10. Conversely, lower frequency sampled data is unaffected by the filter 30, and therefore the output of the table 34 is likewise unaffected.

The output of the non-linear processor 10 is applied to a digital-to-analog(D/A) converter 40, which converts the digital samples into an analog signal. A low pass filter 42 is provided to remove any artifacts produced by the D/A converter 40. Since the fundamental passband does not have any folded-back contributions from the harmonic replicas, the spectrum of the sampled signal is reproduced without any aliasing. While the display 22 is shown following the low pass filter 42, in actual practice the output of the telecine is usually recorded on magnetic tape and transmitted over some channel before ultimately being displayed. None of this, however, changes the principle of the invention.

The low pass filter 30 may be a spatial filter operable over an area of input image elements. For example, the filter configuration of FIG. 4 may operate over a 3×3 array of elements a-i, as follows

| | | |
|---|---|---|
| i | h | g |
| f | e | d |
| c | b | a |

Figure 4:
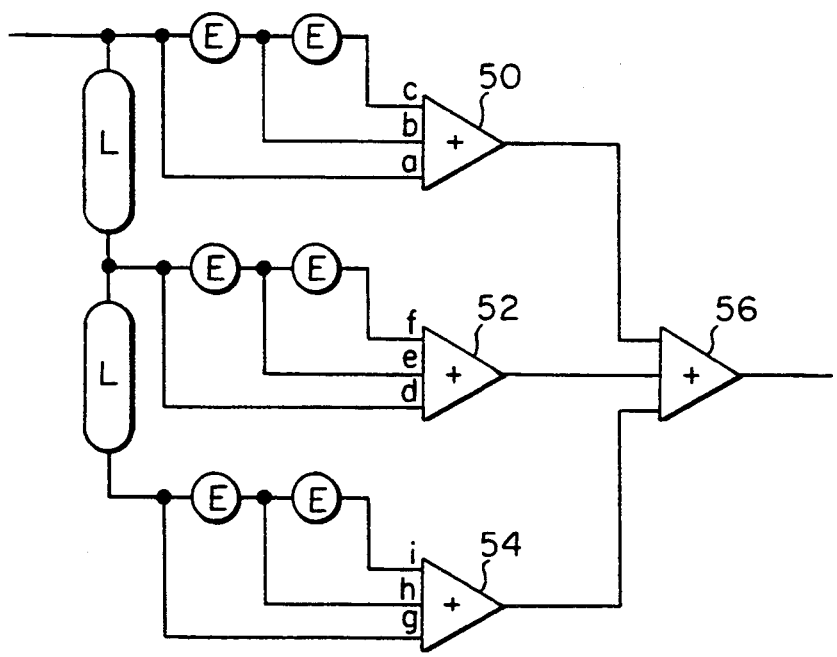
FIG. 4 is a circuit diagram of a low pass filter generally useful in the non-linear processor of FIG. 1.

The circuit elements labelled "1" in FIG. 4 are line delays and the circuit elements labelled "e" are element delays.

The delayed signals are input to an array of summing elements 50, 52, 54, and 56. The factors a-i at the inputs to summing elements 50, 52, and 54 represent weights that are applied to each input element. For instance, if b=d=f=h=1, e=2, and a=c=g=i=0, then the following low pass filter function is obtained:

| | | |
|---|---|---|
| 0 | 1 | 0 |
| 1 | 2 | 1 |
| 0 | 1 | 0 |

This filter, for the center element e, performs a smoothing function of 1,2,1 in the vertical direction together with a smoothing function of 1,2,1 in the horizontal direction to generate a mean value for the center element over a neighborhood of nine elements.

Besides reducing the level of high frequency harmonics, another advantage of the invention is that the filter function of filter 30 is relatively simple to implement. The filter function can also be adjusted to optimize system characteristics(e.g., by changing the weights a-i). In contrast with prior systems, the levels of the high frequency components can be more accurately maintained. Moreover, the system can be used on baseband as well as high high pass data.

Figure 3:
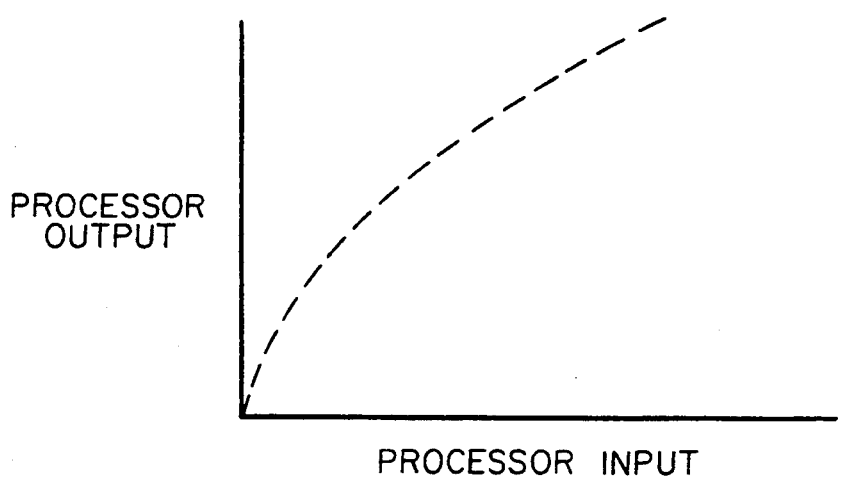
FIG. 3 is a graph of a simplified gamma function that may also be implemented by the non-linear processor of FIG. 1.

While the invention has been described with particular reference to a preferred embodiment, it will be understood by those skilled in the art that various changes may be made and equivalents may be substituted for elements of the preferred embodiment without departing from the invention. For instance, FIG. 3 shows a further simplification that can be made by reducing the number of the bits coming out of the filter 30, which results in the non-linear characteristic being a series of straight lines. Moreover, the principle of the invention applies regardless of the non-linear operation that might be performed on this, or any other, data. For instance, the telecine film scanner may perform a logarithmic color masking function in which the sampled data is logged and matrixed in the non-linear processor 10. The same problem with upper harmonic content would be present, and the same benefit would be obtained by practice of the invention.

What is claimed is:

1. A method for the processing of sampled data, said method comprising the steps of:
   storing a non-linear function in a look-up table memory such that each table input generates a table output based upon the transfer characteristic of the non-linear function;
   low pass filtering the sampled data;
   addressing the input of the look-up table memory with the low pass filtered data; and
   multiplying the sampled data by the output of the look-up table memory.

2. A method as claimed in claim 1 further including the step of delaying the sampled data input to the multiplying step so as to equalize the delay inherent in the low pass filtering step.

3. A method as claimed in claim 1 wherein the sampled data represents image elements, and said low pass filtering step comprises spatially filtering a two-dimensional array of input image elements.

4. Signal processing apparatus for implementing a non-linear function upon sampled data, said apparatus comprising:
   means for low pass filtering the sampled data to generate sampled low pass data;
   memory look-up means for converting the sampled low pass data into multiplier coefficients based upon the transfer characteristic of the non-linear function; and
   means for multiplying the sampled data by the multiplier coefficients to generate the output of the apparatus.

5. Apparatus as claimed in claim 2 further including means for delaying the sampled data input to said multiplying means so as to equalize the delay inherent in said low pass filtering means.

6. Apparatus as claimed in claim 2 wherein the sampled data represents image elements, and said low pass filtering means comprises a spatial filter operable over a two-dimensional array of input image elements.

7. Apparatus as claimed in claim 6 wherein the transfer characteristic implemented by said memory look-up means comprises a gamma function.

8. Apparatus as claimed in claim 6, wherein the transfer characteristic implemented by said memory look-up means comprises a logarithmic function.

9. Apparatus as claimed in claim 6 wherein said sampled data represents color image elements, and the transfer characteristic implemented by said memory look-up means comprises a color masking function.

10. Apparatus as claimed in claim 2 further including means for digitizing the sampled data input to said low pass filtering means and said multiplying means.

11. Apparatus as claimed in claim 10 wherein said low pass filtering means processes the digitized data and reduces the number of bits at its output, thereby resulting in the transfer characteristic implemented by said memory look-up means being a series of separate straight-line segments.

* * * * *